United States Patent
Chung et al.

(10) Patent No.: US 8,023,337 B2
(45) Date of Patent: Sep. 20, 2011

(54) SEMICONDUCTOR MEMORY DEVICE

(75) Inventors: Hoe-Ju Chung, Yongin-si (KR);
Ki-Whan Song, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 125 days.

(21) Appl. No.: 12/591,176

(22) Filed: Nov. 12, 2009

(65) Prior Publication Data

US 2010/0118616 A1    May 13, 2010

(30) Foreign Application Priority Data

Nov. 11, 2008   (KR) .................. 10-2008-0111797

(51) Int. Cl.
*G11C 16/04*        (2006.01)
(52) U.S. Cl. ............... 365/189.02; 365/205; 365/230.06; 365/189.05
(58) Field of Classification Search ............. 365/189.02, 365/205, 230.06, 189.05, 191
See application file for complete search history.

(56) References Cited

U.S. PATENT DOCUMENTS

| | | | |
|---|---|---|---|
| 5,359,556 A | 10/1994 | Kimara et al. | |
| 6,034,910 A | 3/2000 | Iwase | |
| 6,711,067 B1 * | 3/2004 | Kablanian | 365/189.02 |
| 6,768,962 B2 | 7/2004 | Bullinger | |
| 2008/0123439 A1 | 5/2008 | Park et al. | |

FOREIGN PATENT DOCUMENTS

| | | |
|---|---|---|
| CN | 101231882 | 7/2008 |
| DE | 102007057097 | 6/2008 |
| JP | 05-189975 | 7/1993 |
| KR | 1020080047097 | 5/2008 |
| KR | 1020080058806 | 6/2008 |
| KR | 1020080058807 | 6/2008 |
| TW | 200839783 | 10/2008 |

* cited by examiner

*Primary Examiner* — David Lam
(74) *Attorney, Agent, or Firm* — Harness, Dickey & Pierce, P.L.C.

(57) ABSTRACT

A semiconductor memory device having shared sense amplifiers is provided. The semiconductor memory device has a bit-line selector disposed closer to a memory cell array than a column decoder. When the column decoder outputs a bit-line indication signal corresponding to the number of bit lines, the bit-line selector selects a plurality of bit lines in response to the bit-line indication signal. Thus, it is possible to reduce the number of signals output from the column decoder.

14 Claims, 9 Drawing Sheets

SEMICONDUCTOR MEMORY DEVICE

CROSS-REFERENCE TO RELATED APPLICATION

This application claims the benefit of priority under 35 U.S.C. §119 from Korean Patent Application No. 10-2008-0111797, filed on Nov. 11, 2008, the contents of which are hereby incorporated herein by reference in its entirety.

BACKGROUND

1. Field

Example embodiments relate to a semiconductor memory device, and more particularly, to a semiconductor memory device having shared bit-line sense amplifiers.

2. Description of Related Art

Semiconductor memory devices may have higher operating speed, lower power consumption, higher degree of integration, and/or smaller size. To these ends, a semiconductor memory device in which a plurality of bit lines use one sense amplifier in common has been made. In order for a column decoder to select the bit lines, a number of column selection lines should be the same as a plurality of bit lines.

SUMMARY

Example embodiments provide a semiconductor memory device in which a column decoder outputs a reduced number of signals.

Example embodiments are directed to a semiconductor memory device. The semiconductor memory device may include at least one memory cell array, a column decoder, at least one bit-line selector, at least one switch unit, and at least one shared sense amplifier unit. The memory cell array may have a plurality of memory cells between a plurality of word lines and n (n is a natural number equal to $2^k$) bit lines. The column decoder outputs a k-bit bit-line indication signal in response to a column address. The bit-line selector selects, activates and outputs one of n bit-line selection signals in response to the bit-line indication signal. The switch unit has n switches having one end connected with the n bit lines and the other end circularly connected with i (i is a natural number larger than 1 and smaller than n) sensing lines in sequence, and activated in response to the n bit-line selection signals. The shared sense amplifier unit has i sense amplifiers sensing and amplifying data applied through the i sensing lines.

In example embodiments, the column decoder may receive a burst length signal and may output a read burst signal clocking a number of times corresponding to the burst length signal and a read finish signal activated after clocking of the read burst signal. The bit-line selector may sequentially activate and output as many bit-line selection signals as a number of clock counts of the read burst signal, beginning with the selected bit-line selection signal.

In example embodiments, the bit-line selector may include: a decoder configured to decode the bit-line indication signal and generate an n-bit coding signal; a bit-line selection signal output unit configured to select the one of the n bit-line selection signals in response to the n-bit coding signal, and sequentially activate and output a desired or alternatively predetermined number of bit-line selection signals beginning with the selected bit-line selection signal in response to the read burst signal. The bit-line selector may further include a sense amplifier enable signal output unit configured to output i sense amplifier enable signals activating the corresponding sense amplifiers in response to the corresponding bit-line selection signals among the n bit-line selection signals.

In example embodiments, the bit-line selection signal output unit may have n circularly-connected latches; the n latches may respectively output the bit-line selection signals in response to the one corresponding bit of the n-bit coding signal and the bit-line selection signal output from the latch at a previous stage. Each of the n latches may include: a logical OR gate configured to perform logical OR on the one corresponding bit of the n-bit coding signal and the bit-line selection signal output from the latch at a previous stage and output a signal. Further, the bit-line selector may have a dual edge flip-flop configured to latch and output the output signal of the logical OR gate in response to rising and falling edges of the read burst signal, and be reset in response to the read finish signal.

In example embodiments, the shared sense amplifier unit may include: an amplifier unit having i sense amplifiers activated in response to the corresponding sense amplifier enable signals among the i sense amplifier enable signals, sensing and amplifying the data applied through the sensing lines, and outputting signals. The shared sense amplifier may also include a multiplexer (MUX) configured to select one of the signals output from the i sense amplifiers in response to the sense amplifier enable signals and transfer the selected signal to an input/output line.

In example embodiments, the bit-line selector may include: a decoder configured to decode the bit-line indication signal and generate an m-bit (m=n/2) coding signal; a first bit-line selection signal output unit configured to select one of m odd-numbered bit-line selection signals in response to the m-bit coding signal, and having m circularly-connected first latches sequentially activating and outputting a desired or alternatively predetermined number of odd-numbered bit-line selection signals. The first bit-line selector begins with the selected bit-line selection signal in response to a rising edge of the read burst signal. The bit line selector may further includes a second bit-line selection signal output unit configured to select one of m even-numbered bit-line selection signals in response to the m-bit coding signal, and having m circularly-connected second latches sequentially activating and outputting a desired or alternatively predetermined number of even-numbered bit-line selection signals beginning with the selected bit-line selection signal in response to a falling edge of the read burst signal. The bit line selector may additionally include a first sense amplifier enable signal output unit configured to output j (j=i/2) first sense amplifier enable signals activating the corresponding sense amplifiers in response to the corresponding bit-line selection signals among the m odd-numbered bit-line selection signals output from the first bit-line selection signal output unit; and a second sense amplifier enable signal output unit configured to output j second sense amplifier enable signals activating the corresponding sense amplifiers in response to the corresponding bit-line selection signals among the m even-numbered bit-line selection signals output from the second bit-line selection signal output unit.

In example embodiments, each of the first and second bit-line selection signal output units may include m circularly-connected latches, the m latches may respectively output the bit-line selection signals in response to the corresponding bit of the m-bit coding signal and the bit-line selection signal output from a previous stage. Each of the m latches of the first bit-line selection signal output unit may include: a first logical OR gate configured to perform logical OR on the one corresponding bit of the m-bit coding signal and the bit-line selection signal output from a previous stage, and output a signal; and a rising edge flip-flop configured to latch and output the output signal of the first logical OR gate in response to a rising edge of the read burst signal, and be reset in response to the read finish signal. Each of the m latches of the second bit-line selection signal output unit may include: a second logical OR gate configured to perform logical OR on the one corresponding bit of the m-bit coding signal and the bit-line selection signal output from a previous stage, and output a signal; and a falling edge flip-flop configured to latch and output the output signal of the second logical OR gate in response to a falling edge of the read burst signal, and be reset in response to the read finish signal.

In example embodiments, the shared sense amplifier unit may include: an amplifier unit having i sense amplifiers activated in response to the j corresponding first sense amplifier enable signals and the j corresponding second sense amplifier enable signals, sensing and amplifying the data applied through the sensing lines, and outputting signals. The shared sense amplifier further includes a MUX configured to select one of the signals output from the i sense amplifiers in response to the first and second sense amplifier enable signals and transfer the selected signal to an input/output line.

In example embodiments, when there are a plurality of memory cell arrays, there may be as many switch units, shared sense amplifier units and bit-line selectors as the number of the memory cell arrays. Additionally, the column decoder may output an input/output selection signal for selecting one of outputs of the shared sense amplifier units and transferring the selected output to an input/output line.

According to another embodiment, there is provided an integrated circuit including a memory cell array, a bit-line selector, and a shared sense amplifier unit. The shared sense amplifier has an amplifier unit that has a plurality of sense amplifiers, an input/output multiplexer that selects one of the output signals of the sense amplifiers and outputs the selected output signal to an input/output line.

In example embodiments, when there are a plurality of memory cell arrays, there may be as many switch units and shared sense amplifier units as the number of the memory cell arrays, the n switches of each switch unit may be activated by receiving the n bit-line selection signals applied from the one bit-line selector in common. Additionally, the column decoder may output an input/output selection signal for selecting one of outputs of the shared sense amplifier units and transferring the selected output to an input/output line.

BRIEF DESCRIPTION OF THE DRAWINGS

Example embodiments will be more clearly understood from the following detailed description taken in conjunction with the accompanying drawings in which.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1:
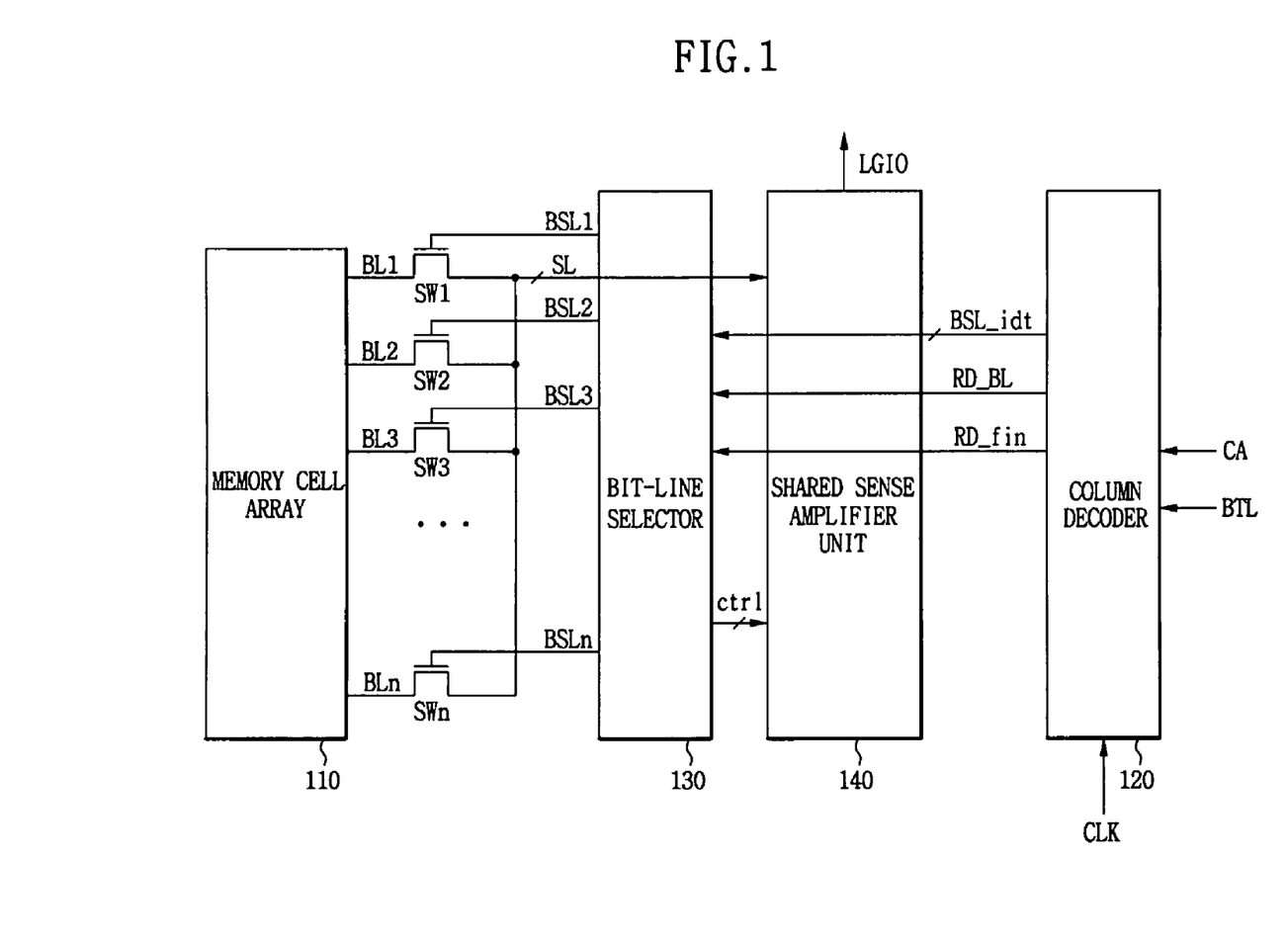
FIG. 1 illustrates a semiconductor memory device according to an example embodiment.

FIG. 1 illustrates a semiconductor memory device 100 according to an example embodiment.

A memory cell array 110 has a plurality of bit lines BL1 to BLn, a plurality of word lines (not shown), and memory cells (not shown) between the bit lines BL1 to BLn and the word lines. Groups of the bit lines BL1 to BLn are respectively connected with a plurality of sensing lines SL through a plurality of bit-line switches SW1 to SWn which are respectively activated in response to bit-line selection signals BSL1 to BSLn. The sensing lines SL are connected with a plurality of sense amplifiers of a shared sense amplifier unit 140, respectively.

A column decoder 120 receives and decodes a column address CA among addresses applied from an extended system, and outputs a bit-line indication signal BSL_idt for indicating a bit line corresponding to the column address CA among the bit lines BL1 to BLn. In response to a burst length signal BTL, the column decoder 120 outputs a read burst signal RD_BL for indicating the number of bit lines successively selected after an initial bit line indicated by the bit-line indication signal BSL_idt. Also, the column decoder 120 outputs a read finish signal RD_fin for resetting a bit-line selector 130. Here, the bit-line indication signal BSL_idt has the number of bits corresponding to the number of the bit lines BL1 to BLn, and the number of bits is equal to $\log_2 n$ (n is equal to $2^k$, k is a natural number). The read burst signal RD_BL is a clock signal having the frequency of generating determined according to the burst length signal BTL. For example, when the number of bit lines is 8, the bit line indication signal BSL_idt is a 3-bit signal. When the burst length signal BTL is 8 in a double data rate (DDR) semiconductor memory device 100, the read burst signal RD_BL is clocked four times corresponding to the half of the burst length. For convenience, a DDR semiconductor memory device 100 has been described as an example, but example embodiments are not limited to the DDR semiconductor memory device 100.

In response to the bit-line indication signal BSL_idt, the bit-line selector 130 activates one (e.g., BSL) of the bit-line selection signals BSL1 to BSLn and selects one (BL) of the bit lines BL1 to BLn. In response to the read burst signal RD_BL (for example RD_BL=8), the bit-line selector 130 sequentially activates the bit-line selection signals BSL5 to BSL11 to sequentially select the bit lines BL5 to BL11 following the selected bit line BL4 and corresponding to a burst length. The bit-line selector 130 sequentially activates a plurality of sense amplifiers of the shared sense amplifier unit 140, and outputs a control signal ctrl such that output signals of the activated sense amplifiers are output to an input/output line LGIO.

The shared sense amplifier unit 140 has m (m is a natural number more than 2 and less than n) sense amplifiers, which sequentially receive, sense and amplify data applied through the bit lines BL4 to BL11 which is sequentially selected by the bit-line selector 130 in response to the control signal ctrl. The shared sense amplifier 140 outputs the amplified data to the input/output line LGIO. The shared sense amplifier unit 140 may include a number of sense amplifiers less than the number n (n is a natural number) of the bit lines BL1 to BLn, and the groups of the bit lines BL1 to BLn are respectively connected with the sense amplifiers.

In the semiconductor memory device 100 of FIG. 1, the column decoder 120 does not directly select the bit lines BL1 to BLn through a column selection line, but the bit-line selector 130 receives the bit-line indication signal BSL_idt from the column decoder 120 and selects the bit lines BL1 to BLn. Thus, data can be continuously output by the read burst signal RD_BL.

In FIG. 1, the column decoder 120 receives the burst length signal BTL and a clock signal CLK and outputs the read burst signal RD_BL. However, the bit-line selector 130 may also directly receive the burst length signal BTL and the clock signal CLK and outputs the read burst signal RD_BL.

Figure 2:
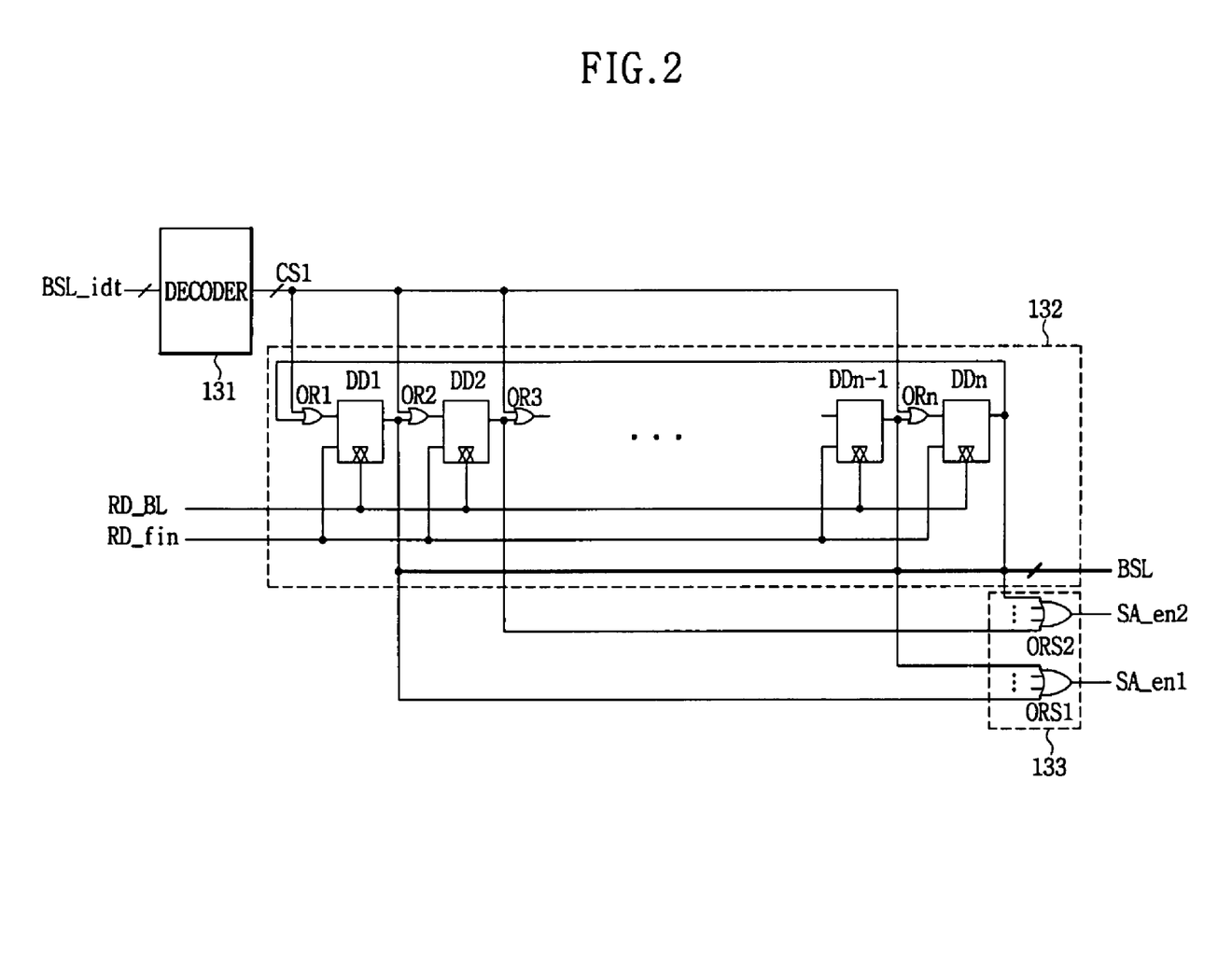
FIG. 2 illustrates a bit-line selector of FIG. 1 according to an example embodiment.

FIG. 2 illustrates the bit-line selector of FIG. 1 according to an example embodiment.

In FIG. 2, the decoder 131 decodes the bit-line indication signal BSL_idt and outputs a coding signal CS1. In FIG. 2, the coding signal CS1 has the same number of bits as the number of bit-line selection signals BSL1 to BSLn, and only one of the bits is activated in response to the bit-line indication signal BSL_idt. When the bit-line indication signal BSL_idt is applied, the decoder 131 outputs the coding signal CS1 once, to activate one of bits of a logical OR gate OR1 to ORn or a dual edge flip-flop DD1 to DDn. The decoder 131 then does not output the coding signal CS1 to the remaining logical OR gates OR1 to ORn or the remaining dual edge flip-flops DD1 to DDn or outputs the coding signal CS1 with all the bits of the coding signal CS1 deactivated to the remaining logical OR gates OR1 to ORn or the remaining dual edge flip-flops DD1 to DDn.

A plurality of logical OR gates OR2 to ORn in a bit-line selection signal output unit 132 perform a logical OR on the corresponding bits of the coding signal CS1 and the corresponding bit-line selection signals BSL1 to BSLn−1 that are output signals of dual edge flip-flops DD1 to DDn−1 at previous stages, and output signals. A logical OR gate OR1 at the first stage performs logical OR on the corresponding bit of the coding signal CS1 and the output signal BSLn of a dual edge flip-flop DDn at the last stage, and outputs a signal.

In response to rising and falling edges of the read burst signal RD_BL, the dual edge flip-flops DD1 to DDn latch the output signals of the logical OR gates OR1 to ORn at the previous stages, and output the bit-line selection signals BSL1 to BSLn. As described above, the read burst signal RD_BL is a clock signal having the frequency of generating counts determined according to the burst length signal BTL. Thus, while the read burst signal RD_BL is being clocked, the dual edge flip-flops DD1 to DDn latch the output signals of the logical OR gates OR1 to ORn at the previous stages and output the bit-line selection signals BSL1 to BSLn to the logical OR gates OR1 to ORn at the next stages. The dual edge flip-flops DD1 to DDn may then be reset in response to the read finish signal RD_fin.

Thus, when the read burst signal RD_BL is clocked after the coding signal CS1 is applied, the logical OR gates OR1 to ORn and the dual edge flip-flops DD1 to DDn activate and output one bit-line selection signal corresponding to the coding signal CS1 in response to an edge of the read burst signal RD_BL, and then sequentially activate and output bit-line selection signals until clocking of the read burst signal RD_BL is finished. When an activated bit-line selection signal is the last bit-line selection signal BSLn, the first bit-line selection signal BSL1 is activated the next time in rotation.

Two logical OR gates ORS1 and ORS2 in a sense amplifier enable signal output unit 133 output sense amplifier enable signals SA_en1 and SA_en2 respectively, which are the control signals ctrl activating a plurality of sense amplifiers of the shared sense amplifier unit 140. The first logical OR gate ORS1 activates and outputs the sense amplifier enable signal SA_en1 when the bit-line selection signal BSL1, BSL3, . . . , or BSLn−1 is activated, and the second logical OR gate ORS2 activates and outputs the sense amplifier enable signal SA_en2 when the bit-line selection signal BSL2, BSL4, . . . , or BSLn is activated. In FIG. 2, the shared sense amplifier unit 140 has two sense amplifiers, to which the two sense amplifier enable signals SA_en1 and SA_en2 are output, respectively. However, the number of sense amplifier enable signals may be adjusted according to the number of sense amplifiers of the shared sense amplifier unit 140.

Figure 3:
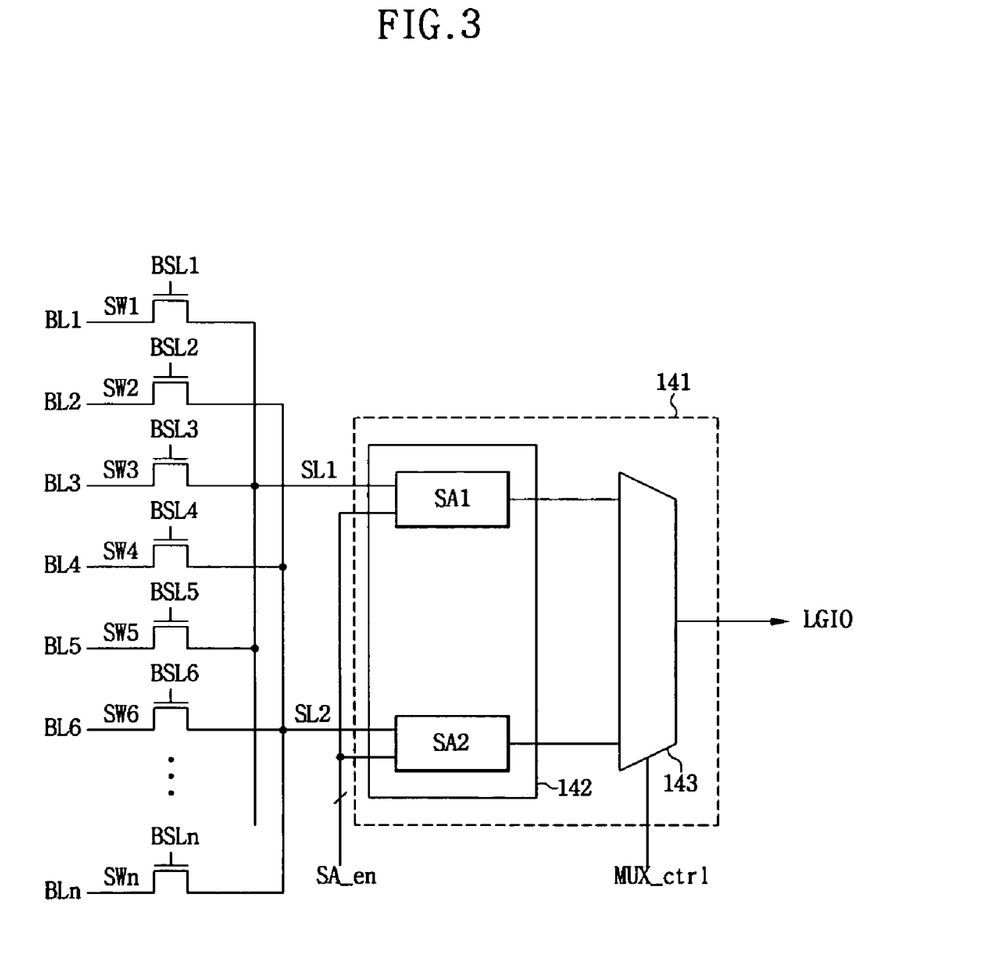
FIG. 3 illustrates a shared sense amplifier unit of FIG. 1 according to an example embodiment.

FIG. 3 illustrates a shared sense amplifier unit 140 corresponding to the bit-line selector of FIG. 2 as the shared sense amplifier 140 of FIG. 1 according to an example embodiment.

The shared sense amplifier unit 140 may include an amplifier unit 142 that has a plurality of sense amplifiers SA1 and SA2, and an input/output multiplexer (MUX) 143 that selects one of output signals of the sense amplifiers SA1 and SA2 and outputs the selected output signal to the input/output line LGIO. The sense amplifier SA1 may be connected with the odd-numbered bit lines BL1, BL3, . . . , and BLn−1 through the bit-line switches SW1, SW3, . . . , and SWn−1 and a sensing line SL1 and activated in response to the sense amplifier enable signal SA_en1. The sense amplifier SA2 may be connected with the even-numbered bit lines BL2, BL4, . . . , and BLn through the bit-line switches SW2, SW4, . . . , and SWn and a sensing line SL2, and activated in response to the sense amplifier enable signal SA_en2. The input/output MUX 143 selects one of output signals of the sense amplifiers SA1 and SA2 in response to a MUX control signal MUX_ctrl that is the control signal ctrl applied from the bit-line selector. The MUX control signal MUX_ctrl may be the sense amplifier enable signals SA_en1 and SA_en2, or a signal obtained by encoding the sense amplifier enable signals SA_en1 and SA_en2.

Figure 4:
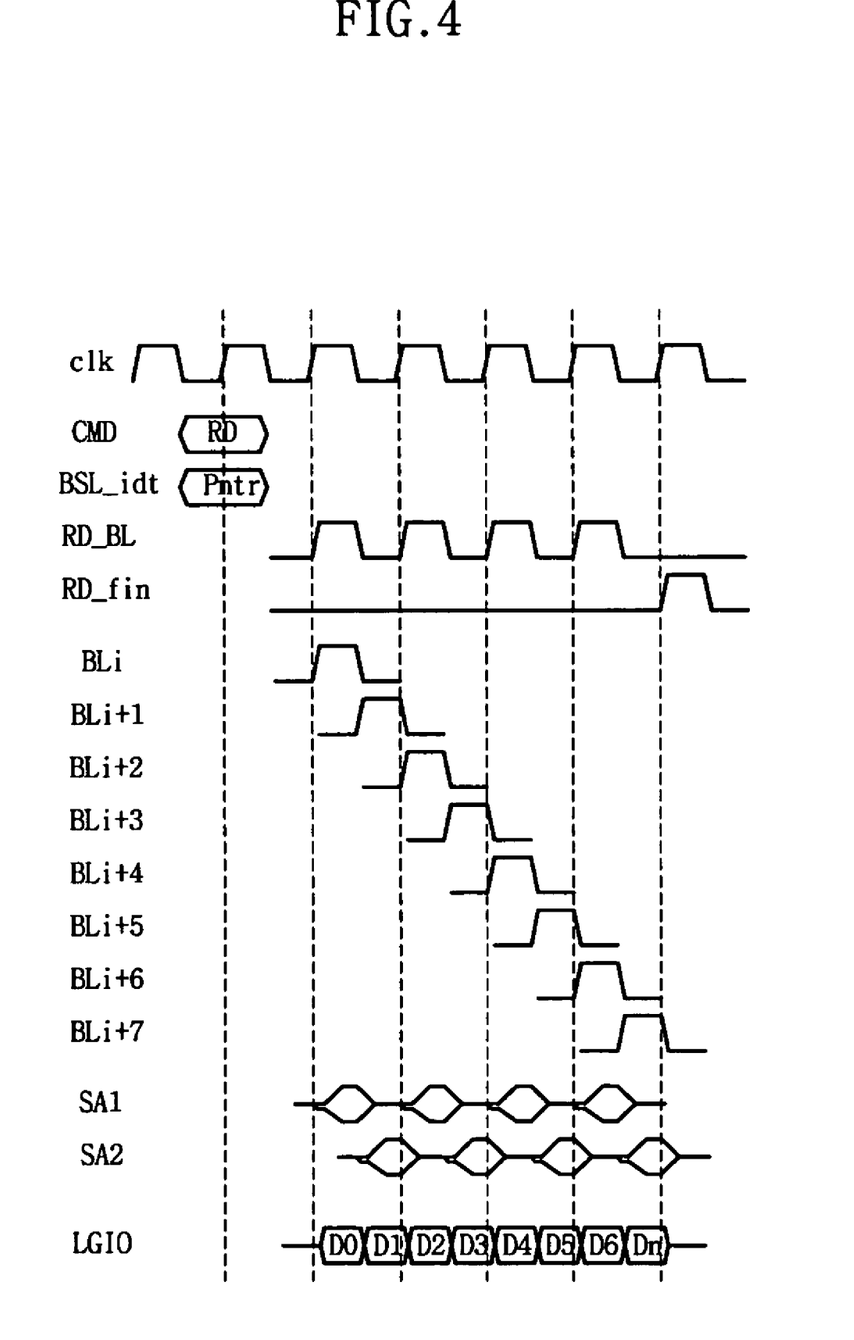
FIG. 4 is a timing diagram illustrating operation of the bit-line selector of FIG. 2 and the shared sense amplifier unit of FIG. 3.

FIG. 4 is a timing diagram illustrating operation of the bit-line 130 selector of FIG. 2 and the shared sense amplifier unit 140 of FIG. 3.

When an address is applied to the semiconductor memory device 100 together with a read command, a command decoder (not shown) of the semiconductor memory device 100 decodes the read command and outputs an internal read signal RD. The column decoder 120 decodes a column address and outputs the bit-line indication signal BSL_idt as a pointer indicating the bit lines BL1 to BLn to be selected. Also, the column decoder 120 outputs the read burst signal RD_BL, such that the bit-line selector 130 continuously indicates bit lines and outputs a read finish signal RD_fin when clocking of the read burst signal RD_BL is finished.

The decoder 131 of the bit-line selector 130 decodes the bit-line indication signal BSL_idt and outputs the coding signal CS1 and the bit-line selection signal output unit 132 sequentially activates and outputs a number of bit-line selection signals BSLi+1 to BSLi+7 corresponding to a burst length in response to the coding signal CS1 and the read burst signal RD_BL, beginning with the corresponding bit-line selection signal BSLi. FIG. 4 illustrates an example in which the burst length is 8. Thus, the read burst signal RD_BL is clocked four times. In response to rising and falling edges of the read burst signal RD_BL, the dual edge flip-flops DD1 to DDn of the bit-line selection signal output unit 132 latch output signals of the logical OR gates OR1 to ORn and sequentially activate the eight bit-line selection signals BSLi to BSLi+7. The two logical OR gates ORS1 and ORS2 of the sense amplifier enable signal output unit 133 activate and output the sense amplifier enable signals SA_en1 and SA_en2, respectively in response to activation of the corresponding bit-line selection signals (BSLi+0, BSLi+2, . . . , and BSLi+6) and (BSLi+1, BSLi+3, . . . , and BSLi+7). When the read finish signal RD_fin is activated, the dual edge flip-flops DD1 to DDn of the bit-line selection signal output unit 132 are reset.

The sequentially activated bit-line selection signals BSLi to BSLi+7 activate the switches SWi to SWi+7 respectively, and the activated switches SWi to SWi+7 sequentially connect the corresponding bit lines BLi to BLi+7 with the corresponding sense amplifiers SA1 and SA2 of the shared sense amplifier unit 140.

The sense amplifiers SA1 and SA2 of the shared sense amplifier unit 140 are activated in response to the corresponding sense amplifier enable signals SA_en1 and SA_en2. Thus, the two sense amplifiers SA1 and SA2 sense, amplify and output data sequentially transferred through the bit lines BLi to BLi+7. Each of the sense amplifiers SA1 and SA2 is activated four times while the read burst signal RD_BL is clocked four times. The MUX 143 selects one of the two sense amplifiers SA1 and SA2 in response to the MUX control signal MUX_ctrl, and transfers an output signal of the selected sense amplifier SA1 or SA2 to the input/output line LGIO.

Figure 5:
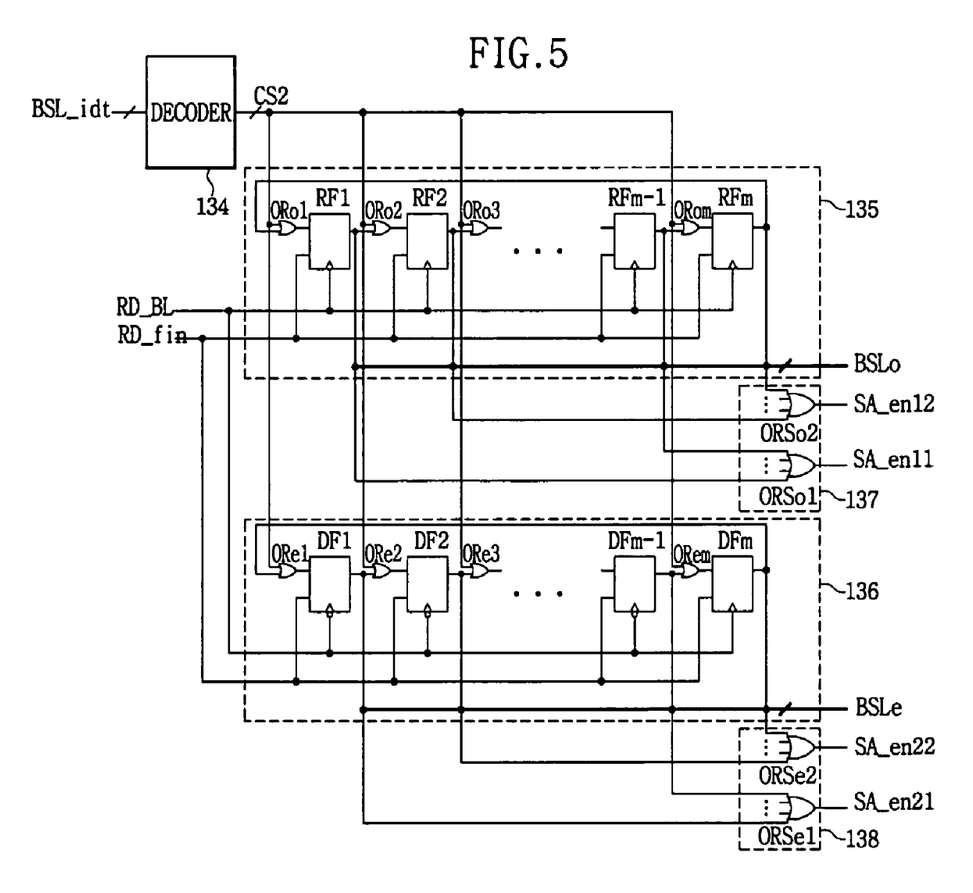
FIG. 5 illustrates a bit-line selector of FIG. 1 according to an example embodiment.

FIG. 5 illustrates the bit-line selector 130 of FIG. 1 according to another example embodiment.

Like the decoder 131 of FIG. 2, a decoder 134 of FIG. 5 also decodes the bit-line indication signal BSL_idt and outputs a coding signal CS2. However, in contrast with the coding signal CS1 of FIG. 2, the coding signal CS2 of FIG. 5 has a number (m=n/2) of bits corresponding to the half of the bit-line selection signals BSL1 to BSLn.

A plurality of logical OR gates ORo2 to ORom in a first bit-line selection signal output unit 135 perform logical OR on the corresponding bits of the coding signal CS2 and first bit-line selection signals BSLo1 to BSLom−1 that are output signals of rising edge flip-flops RF1 to RFm−1 at previous stages, and output signals. A logical OR gate ORo1 at the first stage performs logical OR on the corresponding bit of the coding signal CS2 and an output signal BSLom of a rising edge flip-flop RFm at the last stage, and outputs a signal. In response to a rising edge of the read burst signal RD_BL, the rising edge flip-flops RF1 to RFm latch the output signals of the logical OR gates ORo1 to ORom at the previous stages, and output the first bit-line selection signals BSLo1 to BSLom. While the read burst signal RD_BL is being clocked, the rising edge flip-flops RF1 to RFm latch the output signals of the logical OR gates ORo1 to ORom at the previous stages, and output the first bit-line selection signals BSLo1 to BSLom to the logical OR gates ORo1 to ORom at the next stages. The rising edge flip-flops RF1 to RFm are reset in response to the read finish signal RD_fin.

A plurality of logical OR gates ORe2 to ORem in a second bit-line selection signal output unit 136 perform logical OR on the corresponding bits of the coding signal CS2 and second bit-line selection signals BSLe1 to BSLem−1 that are output signals of falling edge flip-flops DF1 to DFm−1 at previous stages, and output signals. A logical OR gate ORe1 at the first stage performs logical OR on the corresponding bit of the coding signal CS2 and an output signal BSLem of a falling edge flip-flop DFm at the last stage, and outputs a signal. In response to a falling edge of the read burst signal RD_BL, the falling edge flip-flops DF1 to DFm latch the output signals of the logical OR gates ORe1 to ORem at the previous stages, and output the second bit-line selection signals BSLe1 to BSLem. Similarly to rising edge flip-flops RF1 to RFm, while the read burst signal RD_BL is being clocked, the rising edge flip-flops DF1 to DFm also latch the output signals of the logical OR gates ORe1 to ORem at the previous stages, and output the second bit-line selection signals BSLe1 to BSLem to the logical OR gates ORe1 to ORem at the next stages. Also, the falling edge flip-flops DF1 to DFm are reset in response to the read finish signal RD_fin.

Thus, when the read burst signal RD_BL is clocked after the coding signal CS2 is applied, the first and second bit-line selection signal output units 135 and 136 activate and output one first bit-line selection signal corresponding to the coding signal CS2 in response to a rising edge of the read burst signal RD_BL, and activate and output one second bit-line selection signal corresponding to the coding signal CS2 in response to a falling edge of the read burst signal RD_BL. After this, until clocking of the read burst signal RD_BL is finished, the first and second bit-line selection signal output units 135 and 136 sequentially activate and output first and second bit-line selection signals in response to a rising edge and a falling edge of the read burst signal RD_BL, respectively. Also, when the activated first and second bit-line selection signals are the last bit-line selection signals BSLom and BSLem, the first bit-line selection signals BSLo1 and BSLe1 are activated the next rotation.

Two logical OR gates ORSo1 and ORSo2 in a first sense amplifier enable signal output unit 137 output first sense amplifier enable signals SA_en11 and SA_en12 respectively, which are the control signals ctrl activating the corresponding sense amplifiers among a plurality of sense amplifiers of the shared sense amplifier unit 140 of FIG. 1. The logical OR gate ORSo1 activates and outputs the first sense amplifier enable signal SA_en11 when the bit-line selection signal BSL1, BSL5, . . . , or BSLn−3 is activated. The logical OR gate ORSo2 activates and outputs the first sense amplifier enable signal SA_en12 when the bit-line selection signal BSL3, BSL7, . . . , or BSLn−1 is activated.

Two logical OR gates ORSe1 and ORSe2 in a second sense amplifier enable signal output unit 138 output second sense amplifier enable signals SA_en21 and SA_en22 respectively, which are the control signals ctrl activating the corresponding sense amplifiers among a plurality of sense amplifiers of the shared sense amplifier unit 140 of FIG. 1. The logical OR gate ORSe1 activates and outputs the second sense amplifier enable signal SA en21 when the bit-line selection signal BSL2, BSL6, . . . , or BSLn−2 is activated. The logical OR gate ORSe2 activates and outputs the second sense amplifier enable signal SA_en22 when the bit-line selection signal BSL4, BSL8, . . . , or BSLn is activated. In FIG. 5, the shared sense amplifier unit 140 has four sense amplifiers, the four sense amplifier enable signals SA_en11, SA_en12, SA_en21, and SA_en22 are output. However, the number of sense amplifier enable signals may be adjusted according to the number of sense amplifiers of the shared sense amplifier unit 140.

Figure 6:
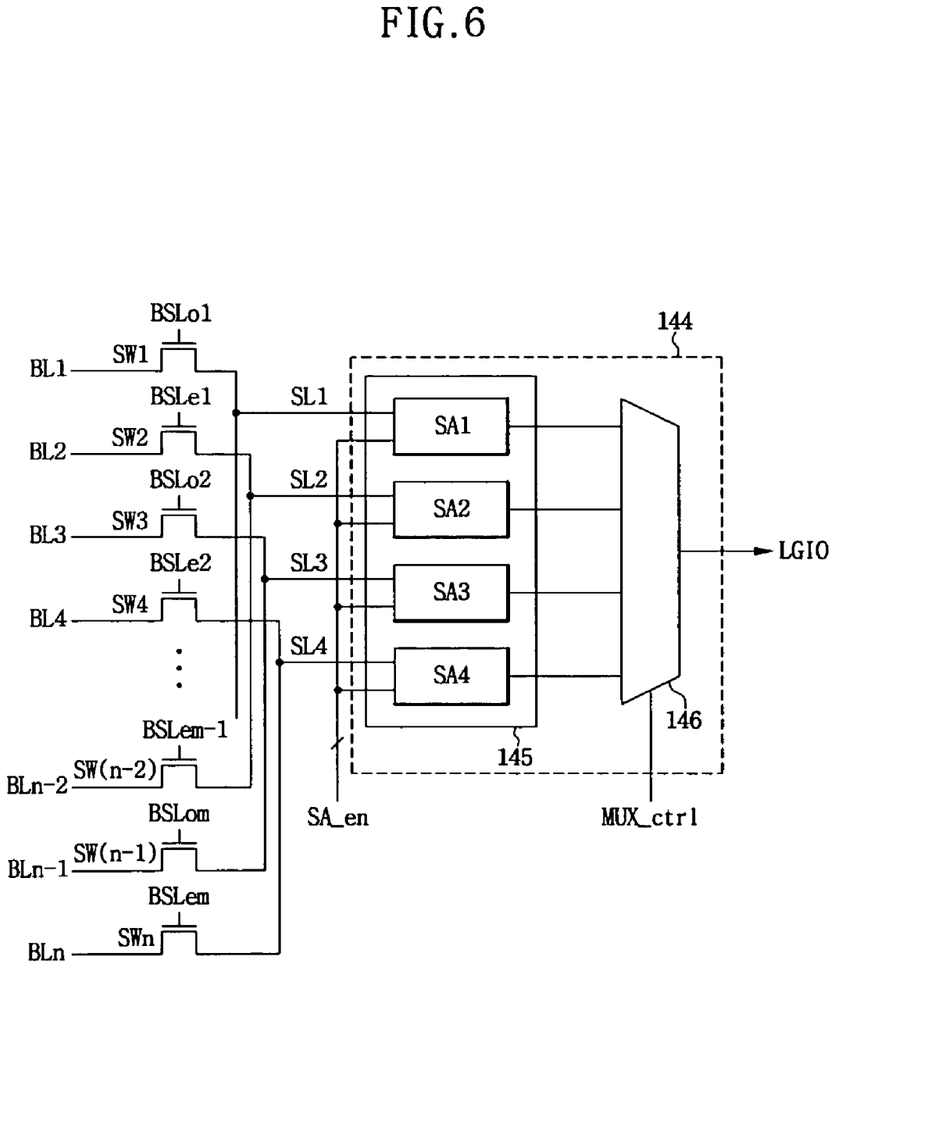
FIG. 6 illustrates a shared sense amplifier unit of FIG. 1 according to an example embodiment.

FIG. 6 illustrates the shared sense amplifier unit 140 of FIG. 1 according to another example embodiment.

A shared sense amplifier unit 140 may include an amplifier unit 145 that has a plurality of sense amplifiers SA1, SA2, SA3 and SA4. The shared sense amplifier unit 140 may further include an input/output MUX 146 that selects one of output signals of the sense amplifiers SA1, SA2, SA3 and SA4 and outputs the selected output signal to the input/output line LGIO. The sense amplifier SA1 is connected with the bit lines BL1, BL5, . . . , and BLn−3 among the odd-numbered bit lines through the bit-line switches SW1, SW5, . . . , and SWn−3 and a sensing line SL1, and activated in response to the sense amplifier enable signal SA_en11. The sense amplifier SA2 is connected with the bit lines BL2, BL6, . . . , and BLn−2 among the even-numbered bit lines through the bit-line switches SW2, SW6, . . . , and SWn−2 and a sensing line SL2, and activated in response to the sense amplifier enable signal SA en21. The sense amplifier SA3 is connected with the bit lines BL3, BL7, . . . , and BLn−1 among the odd-numbered bit lines through the bit-line switches SW3, SW7, . . . , and SWn−1 and a sensing line SL3, and activated in response to the sense amplifier enable signal SA_en12. The sense amplifier SA4 is connected with the bit lines BL4, BL8, . . . , and BLn among the even-numbered bit lines through the bit-line switches SW4, SW8, . . . , and SWn and a sensing line SL4, and activated in response to the sense amplifier enable signal SA_en22.

The input/output MUX 145 selects one of output signals of the sense amplifiers SA1 to SA4 in response to a MUX control signal MUX_ctrl that is the control signal ctrl applied from the bit-line selector. The MUX control signal MUX_ctrl may be the sense amplifier enable signals SA_en11, SA_en12, SA_en21 are SA_en22, or a signal obtained by encoding the sense amplifier enable signals SA_en11, SA_en12, SA_en21 and SA_en22.

Figure 7:
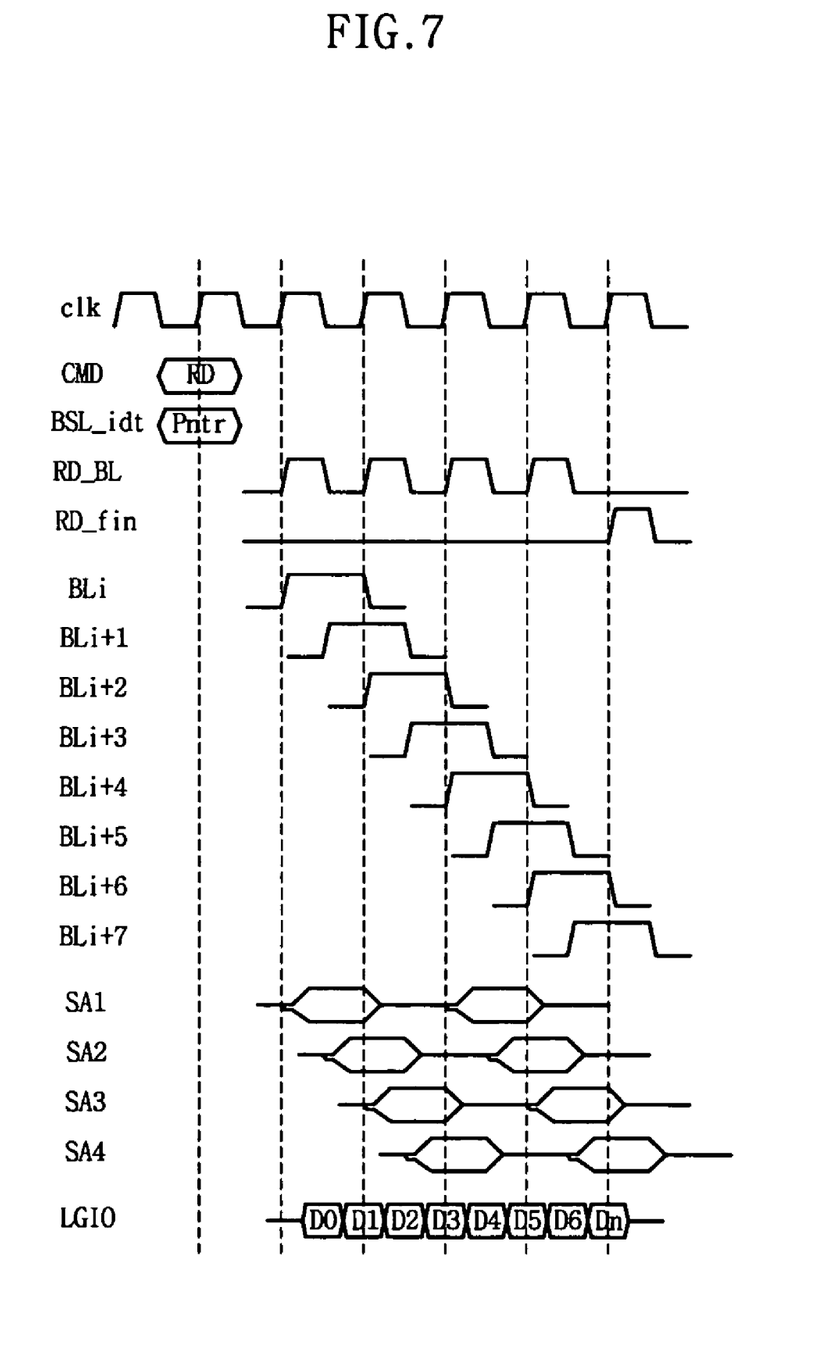
FIG. 7 is a timing diagram illustrating operation of the bit-line selector of FIG. 5 and the shared sense amplifier unit of FIG. 6.

FIG. 7 is a timing diagram illustrating operation of the bit-line selector 130 of FIG. 5 and the shared sense amplifier unit of FIG. 6.

As described with reference to FIG. 4, when an address is applied to the semiconductor memory device together with a read command, a command decoder (not shown) of the semiconductor memory device 100 decodes the read command and outputs an internal read signal RD. Additionally, the column decoder 120 decodes a column address and outputs the bit-line indication signal BSL_idt as a pointer indicating the bit lines BL1 to BLn to be selected. Also, the column decoder 120 outputs the read burst signal RD_BL such that the bit-line selector 130 continuously indicates bit lines, and outputs a read finish signal RD_fin when clocking of the read burst signal RD_BL is finished.

The decoder 134 of the bit-line selector 130 decodes the bit-line indication signal BSL_idt and outputs the coding signal CS2, and the first bit-line selection signal output unit 135 sequentially activates and outputs a number of bit-line selection signals BSLi+2, BSLi+4 and BSLi+6 corresponding to half of a burst length in response to the coding signal CS2 and a rising edge of the read burst signal RD_BL, beginning with the corresponding bit-line selection signal BSLi. The second bit-line selection signal output unit 136 sequentially activates and outputs a number of bit-line selection signals BSLi+3, BSLi+5 and BSLi+7 corresponding to the half of the burst length in response to the coding signal CS2 and a falling edge of the read burst signal RD_BL, beginning with the corresponding bit-line selection signal BSLi+1.

FIG. 7 illustrates an example in which the burst length is 8. Thus, the read burst signal RD_BL is clocked four times, and in response to rising and falling edges of the read burst signal RD_BL, the rising edge flip-flops RF1 to RFm and the falling edge flip-flops DF1 to DFm of the first and second bit-line selection signal output units 135 and 136 latch output signals of the logical OR gates ORo1 to ORom and ORe1 to ORem and sequentially activate the eight bit-line selection signals BSLi to BSLi+7. However, in contrast with the bit-line selection signals of FIG. 4 which are activated for a half cycle of the clock signal CLK, the bit-line selection signals BSLi to BSLi+7 of FIG. 7 are activated for one cycle of the clock signal CLK because the bit-line selector 130 has the two bit-line selection signal output units 135 and 136. Thus, the sections in which the successive bit-line selection signals BSLi to BSLi+7 are activated overlap each other. In other words, after the bit-line selection signal BSLi is activated and before it is deactivated, the bit-line selection signal BSLi+1 is activated. Likewise, before the bit-line selection signal BSLi+1 is deactivated, the bit-line selection signal BSLi+2 is activated.

The two logical OR gates ORSo1 and ORSo2 of the first sense amplifier enable signal output unit 137 activate and output the sense amplifier enable signals SA_en11 and SA_en12 respectively, in response to activation of the corresponding bit-line selection signals (BSLi and BSLi+4) and (BSLi+2 and BSLi+6). The two logical OR gates ORSe1 and ORSe2 of the second sense amplifier enable signal output unit 138 activate and output the sense amplifier enable signals SA_en21 and SA_en22 respectively, in response to activation of the corresponding bit-line selection signals (BSLi+1 and BSLi+5) and (BSLi+3 and BSLi+7). When the read finish signal RD_fin is activated, the rising edge flip-flops RF1 to RFm of the first bit-line selection signal output unit 135 and the falling edge flip-flops DF1 to DFm of the second bit-line selection signal output unit 136 are reset.

The sequentially activated bit-line selection signals BSLi to BSLi+7 respectively activate the corresponding switches SWi to SWi+7, and the activated switches SWi to SWi+7 sequentially connect the corresponding bit lines BLi to BLi+7 with the corresponding sense amplifiers SA1 to SA4 of the shared sense amplifier unit 140.

The sense amplifiers SA1 to SA4 of the shared sense amplifier unit 140 are activated in response to the corresponding sense amplifier enable signals SA_en11, SA_en21, SA_en12 and SA_en22. Thus, the four sense amplifiers SA1 to SA4 sense, amplify and output data sequentially transferred through the bit lines BLi to BLi+7. Each of the sense amplifiers SA1 to SA4 may be activated two times while the read burst signal RD_BL is clocked four times. The MUX 146 selects one of the four sense amplifiers SA1 to SA4 in response to the MUX control signal MUX_ctrl and transfers an output signal of the selected sense amplifier SA1, SA2, SA3 or SA4 to the input/output line LGIO.

As illustrated in FIG. 7, in the semiconductor memory device 100 having the bit-line selector 130 of FIG. 5 and the shared sense amplifier unit 140 of FIG. 6, the respective sense amplifiers SA1 to SA4 sense and amplify data applied through the bit lines BLi to BLi+7 for one cycle of the clock signal CLK. Thus, sensing margin is improved.

Figure 8:
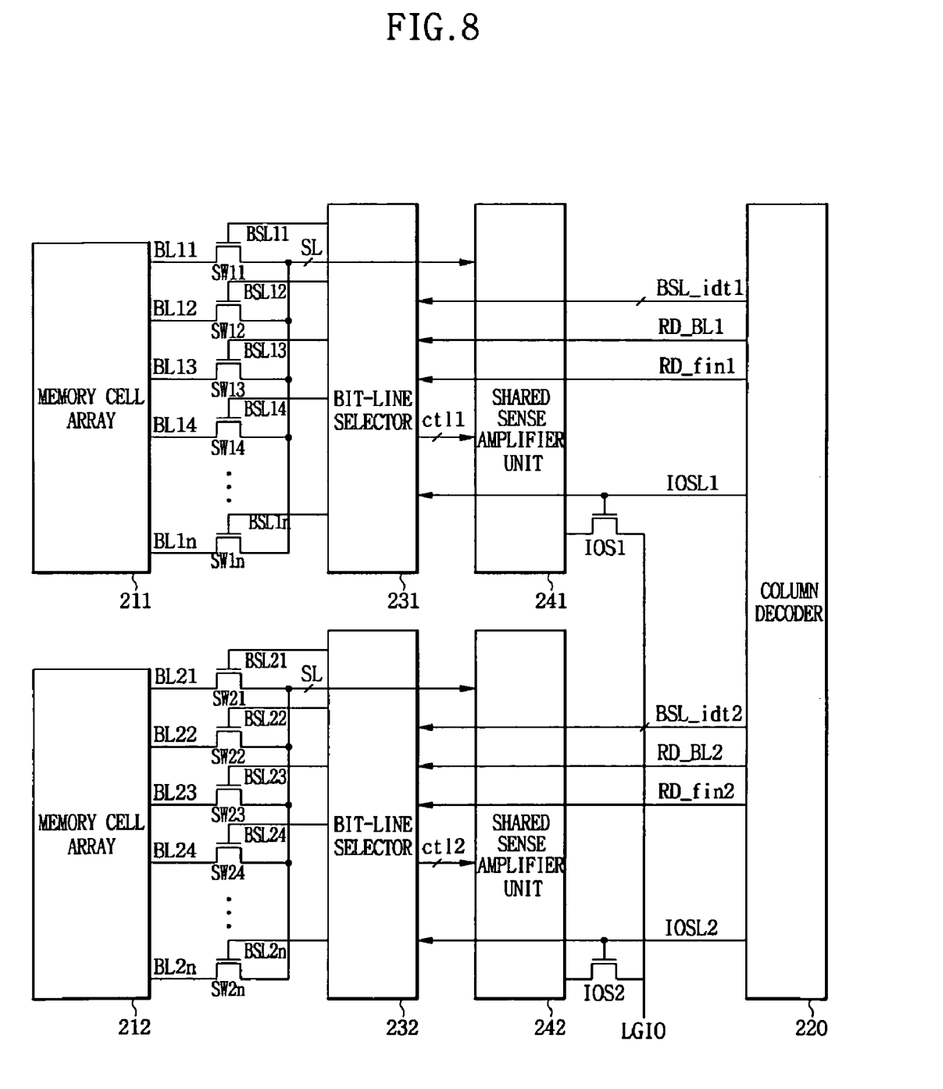
FIG. 8 illustrates a semiconductor memory device according to an example embodiment.

FIG. 8 illustrates a semiconductor memory device 102 having a plurality of memory cell arrays 211 and 212 according to another example embodiment. In FIG. 8, the semiconductor memory device 102 has two memory cell arrays 211 and 212 and two bit-line selectors 231 and 232 and two shared sense amplifier units 241 and 242 corresponding to the respective memory cell arrays 211 and 212. A column decoder 220, the bit-line selectors 231 and 232 and shared sense amplifier units 241 and 242 operate in a similar way as the column decoder 120, the bit-line selector 130 and the shared sense amplifier unit 140 of FIG. 1. However, the column decoder 220 of FIG. 8 may additionally generate and output input/output signals IOSL1 and IOSL2 and the bit-line selectors 231 and 232 are activated in response to the input/output signals IOSL1 and IOSL2. Also, the input/output signals IOSL1 and IOSL2 activate input/output gates IOS1 and IOS2 such that data output from one of the shared sense amplifier units 241 and 242 is transferred to an input/output line LGIO.

The semiconductor memory device 102 of FIG. 8 outputs bit-line indication signals BSL_idt1 and BSL_idt2, read burst signals RD_BL1 and RD_BL2, and read finish signals RD_fin1 and RD_fin2 to the bit-line selectors 231 and 232, respectively. Thus, the bit-line selectors 231 and 232 correspond to the memory cell arrays 211 and 212, respectively.

Figure 9:
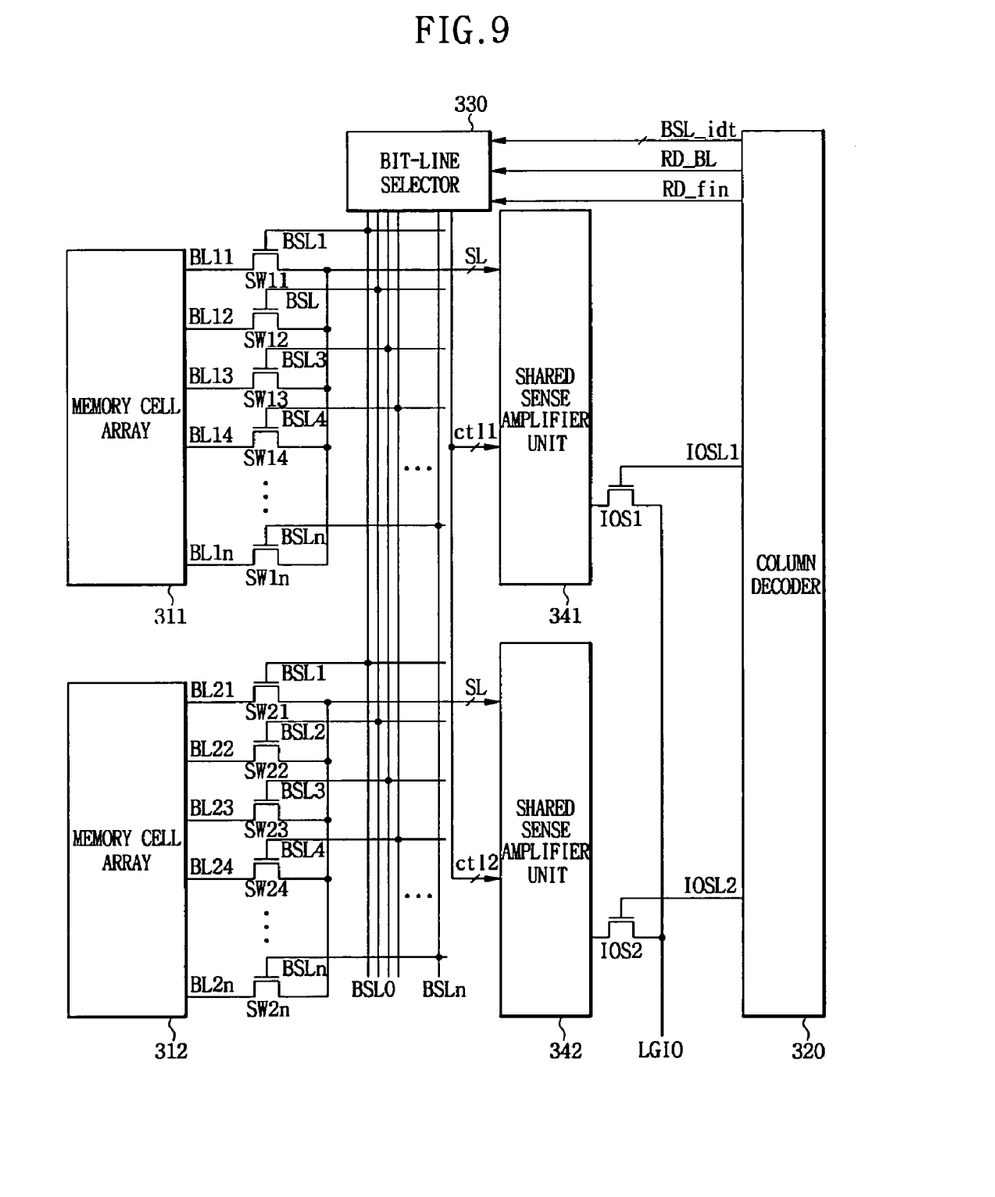
FIG. 9 illustrates a semiconductor memory device according to an example embodiment.

FIG. 9 illustrates a semiconductor memory device 104 according to another example embodiment. Unlike the semiconductor memory device 102 of FIG. 8, the semiconductor memory device 104 of FIG. 9 has one bit-line selector 330. Like the column decoder 120 of FIG. 1, a column decoder 320 outputs a bit-line indication signal BSL_idt, a read burst signal RD_BL, a read finish signal RD_fin, and additionally outputs input/output signals IOSL1 and IOSL2. The semiconductor memory device 104 of FIG. 9 may be configured such that two memory cell arrays 311 and 312 use bit-line selection signals BSL0 to BSLn in common.

Also, the column decoder 320 outputs the input/output signals IOSL1 and IOSL2 to the bit-line selector 330 such that the bit-line selector 330 can activate one of the shared sense amplifier units 341 and 342.

Since the semiconductor memory device 104 of FIG. 9 uses only one bit-line selector 330, the bit-line selector 330 may be arranged more freely than in the semiconductor memory device 102 of FIG. 8, which use two bit-line selectors. Thus, the bit-line selector 330 may be arranged in an area not to increase the size of the semiconductor memory device 104. However, the bit-line selectors 231 and 232 of FIG. 8 may also be arranged in a sense amplifier area or a conjunction area.

In example embodiments, all bit-line selectors sequentially activate bit-line selection signals BSL, but an activation sequence may be adjusted according to the configuration of a bit-line selector.

The semiconductor memory device according to example embodiments may have a bit-line selector disposed closer to a memory cell array than a column decoder. When the column decoder outputs a bit-line indication signal corresponding to the number of bit lines, the bit-line selector selects a plurality of bit lines in response to the bit-line indication signal. Thus, it is possible to reduce the number of signals output from the column decoder and power consumption. Also, although a sense amplifier is shared, a sufficient sensing margin may be ensured.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
at least one memory cell array having a plurality of memory cells between a plurality of word lines and a first number of n bit lines, the first number of being equal to $2^k$ (k is a natural number);
a column decoder configured to output a k-bit bit-line indication signal in response to a column address;
at least one bit-line selector configured to select, activate and output one of the first number bit-line selection signals in response to the bit-line indication signal;
at least one switch unit having the first number switches, having one end connected with the first number bit lines and the other end circularly connected with a second number of sensing lines, the second number being 1 and smaller than the first number in sequence and activated in response to the n bit-line selection signals; and
at least one shared sense amplifier unit having the second number of sense amplifiers sensing and amplifying data applied through the i sensing lines.

2. The semiconductor memory device according to claim 1, wherein the column decoder receives a burst length signal and additionally outputs a read burst signal clocking a number of counts corresponding to the burst length signal and a read finish signal activated after clocking of the read burst signal, and the bit-line selector sequentially activates and outputs as many bit-line selection signals as a number of clocks counts of the read burst signal, beginning with the selected bit-line selection signal.

3. The semiconductor memory device according to claim 2, wherein the bit-line selector includes:

a decoder configured to decode the bit-line indication signal and generate an first number bit coding signal;

a bit-line selection signal output unit configured to select the one of the first number bit-line selection signals in response to the first number-bit coding signal, and sequentially activate and output a number of bit-line selection signals beginning with the selected bit-line selection signal in response to the read burst signal; and a sense amplifier enable signal output unit configured to output second number sense amplifier enable signals activating the corresponding sense amplifiers in response to corresponding bit-line selection signals among the n bit-line selection signals.

4. The semiconductor memory device according to claim 3, wherein the bit-line selection signal output unit has n circularly-connected latches, the first number latches respectively output the bit-line selection signals in response to one corresponding bit of the first number-bit coding signal and the bit-line selection signal output from the latch at a previous stage, and each of the first number latches includes:

a logical OR gate configured to perform logical OR on one corresponding bit of the first number-bit coding signal and the bit-line selection signal output from the latch at a previous stage, and output a signal; and a dual edge flip-flop configured to latch and output the output signal of the logical OR gate in response to rising and falling edges of the read burst signal, and be reset in response to the read finish signal.

5. The semiconductor memory device according to claim 4, wherein the first logical OR gate activates and outputs the sense amplifier enable signal.

6. The semiconductor memory device according to claim 3, wherein the shared sense amplifier unit includes:

an amplifier unit having a second number of sense amplifiers activated in response to corresponding sense amplifier enable signals among the second number sense amplifier enable signals, sensing and amplifying the data applied through the sensing lines, and outputting signals; and a multiplexer (MUX) configured to select one of the signals output from the second number sense amplifiers in response to the sense amplifier enable signals and transfer the selected signal to an input/output line.

7. The semiconductor memory device according to claim 2, wherein the bit-line selector includes:

a decoder configured to decode the bit-line indication signal and generate a third number-bit coding signal, the third number being equal to half the first number;

a first bit-line selection signal output unit configured to select one of third number odd-numbered bit-line selection signals in response to the third number-bit coding signal and having a third number circularly-connected first latches sequentially activating and outputting a number of odd-numbered bit-line selection signals beginning with the selected bit-line selection signal in response to a rising edge of the read burst signal;

a second bit-line selection signal output unit configured to select one of third number even-numbered bit-line selection signals in response to the third number-bit coding signal, and having a third number circularly-connected second latches sequentially activating and outputting a number of even-numbered bit-line selection signals beginning with the selected bit-line selection signal in response to a falling edge of the read burst signal;

a first sense amplifier enable signal output unit configured to output a fourth number first sense amplifier enable signals activating the corresponding sense amplifiers in response to corresponding bit-line selection signals among the m odd-numbered bit-line selection signals output from the first bit-line selection signal output unit, the fourth number being equal to half the second number; and a second sense amplifier enable signal output unit configured to output a fourth number second sense amplifier enable signals activating the corresponding sense amplifiers in response to corresponding bit-line selection signals among the third even-numbered bit-line selection signals output from the second bit-line selection signal output unit.

8. The semiconductor memory device according to claim 7, wherein each of the first and second bit-line selection signal output units includes m circularly-connected latches, the third latches respectively output the bit-line selection signals in response to one corresponding bit of the third-bit coding signal and the bit-line selection signal output from a previous stage, each of the third latches of the first bit-line selection signal output unit includes:

a first logical OR gate configured to perform logical OR on one corresponding bit of the third-bit coding signal and the bit-line selection signal output from a previous stage, and output a signal; and a rising edge flip-flop configured to latch and output the output signal of the first logical OR gate in response to a rising edge of the read burst signal, and be reset in response to the read finish signal, and each of the third number latches of the second bit-line selection signal output unit includes:

a second logical OR gate configured to perform logical OR on one corresponding bit of the third-bit coding signal and the bit-line selection signal output from a previous stage, and output a signal; and a falling edge flip-flop configured to latch and output the output signal of the second logical OR gate in response to a falling edge of the read burst signal and reset in response to the read finish signal.

9. The semiconductor memory device according to claim 8, wherein the shared sense amplifier unit includes:

an amplifier unit having a fourth number sense amplifiers activated in response to corresponding sense amplifier enable signals among the fourth first sense amplifier enable signals and corresponding sense amplifier enable signals among the fourth second sense amplifier enable signals, sensing and amplifying the data applied through the sensing lines, and outputting signals; and a multiplexer (MUX) configured to select one of the signals output from the second sense amplifiers in response to the first and second sense amplifier enable signals and transfer the selected signal to an input/output line.

10. The semiconductor memory device according to claim 1,
wherein there are a plurality of memory cell arrays, there are an equal number switch units, shared sense amplifier units and bit-line selectors as there are memory cell arrays, and the column decoder outputs an input/output selection signal for selecting one of outputs of the shared sense amplifier units and transferring the selected output to an input/output line.

11. The semiconductor memory device according to claim 1,
wherein there are a plurality of memory cell arrays, there are as many switch units and shared sense amplifier units as a number of the memory cell arrays, the n switches of each switch unit are activated by receiving the n bit-line selection signals applied from the one bit-line selector in common, and the column decoder outputs an input/output selection signal for selecting one of outputs of the shared sense amplifier units and transferring the selected output to an input/output line.

12. The semiconductor memory device according to claim 1,
wherein at least one bit-line selector receives a bit-line indication signal from the column decoder and selects a bit line.

13. The semiconductor memory device according to claim 12,
wherein the column decoder receives a burst length signal and a clock signal and outputs a read burst signal.

14. The semiconductor memory device according to claim 13,
wherein the bit-line selector directly receives the burst length signal and the clock signal and outputs the read burst signal.

* * * * *